TRANSISTOR BLOCKING OSCILLATOR

Filed March 15, 1965

INVENTOR.
THOMAS W. BURRUS
BY
Eugene M. Whitacre
Attorney 3,290,612
TRANSISTOR BLOCKING OSCILLATOR

Thomas W. Burrus, Indianapolis, Ind., assignor to Radio Corporation of America, a corporation of Delaware Filed Mar. 15, 1965, Ser. No. 439,606
6 Claims. (Cl. 331—112)

Figure 1:
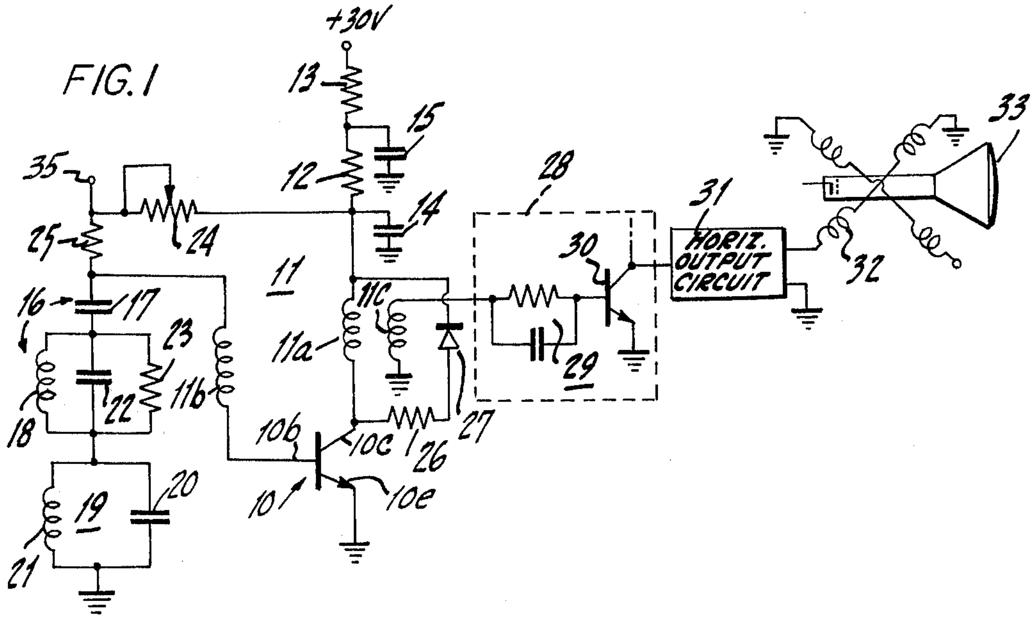

This invention relates to a transistor blocking oscillator and, in particular, to such an oscillator including substantially independent series and parallel resonant circuits for controlling, respectively, the duration of pulses and the period between pulses produced by the blocking oscillator.

The invention is directed to a transistor blocking oscillator wherein the conduction ("on") and nonconduction ("off") times of the transistor are substantially unaffected by variations in transistor parameters.

An object of the invention is, in a blocking oscillator wherein output pulse width is determined primarily by a series resonant circuit, to provide means for decreasing the rise time of the output pulses, i.e. to decrease the time required for the transistor to reach full conduction.

Another object of the invention is to provide a blocking oscillator having series and parallel resonant circuits for controlling pulse width and inter-pulse period, respectively, wherein the components which make up the series and parallel resonant circuits are selected in such proportions that the pulse width and inter-pulse period may be adjusted substantially independently of each other.

A still further object of the invention is to provide a blocking oscillator having series and parallel resonant circuits for controlling pulse width and inter-pulse period wherein the series resonant frequency is substantially independent of the capacitive and inductive values selected for the parallel resonant circuit components and the parallel resonant frequency is substantially independent of the capacitive and inductive values selected for the series resonant circuit components.

While the invention is useful in a wide variety of environments, it is particularly useful in connection with scaning waveform generators for television receivers, an application wherein the duration of the blocking oscillator output pulses is substantially less than the interval between the occurrence of such pulses.

It is a further object of the present invention to provide a transistor blocking oscillator for use in connection with a scanning waveform generator in a television receiver, the blocking oscillator including series and parallel resonant circuits for regulating pulse width and interpulse period, respectively, wherein the parallel resonant circuit is tuned approximately to the line scanning rate of the television receiver and the series resonant circuit is tuned to a higher frequency, the duration of one-half cycle of oscillation at the higher frequency being slightly greater than the duration of the retrace portion of a television line scanning cycle.

Figure 2:
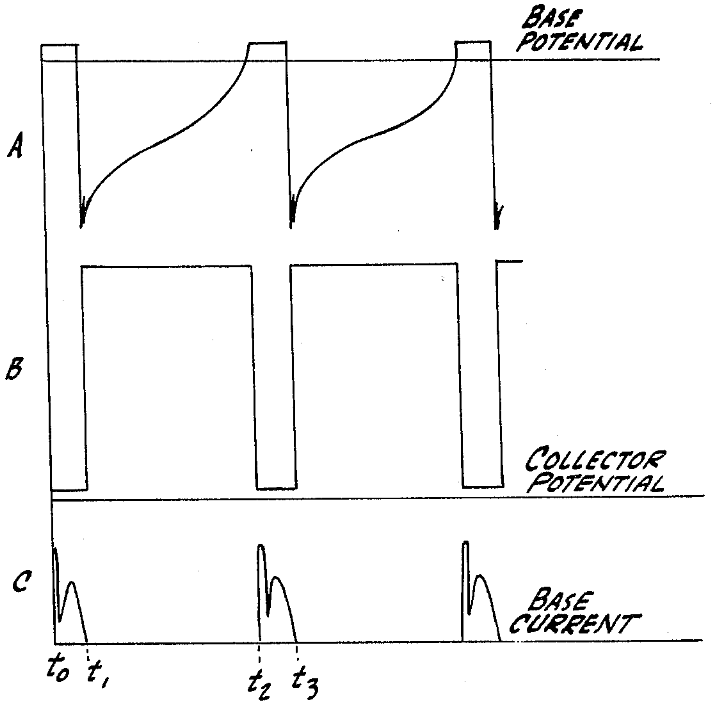

The novel features that are considered characteristic of this invention are set forth with particularity in the appended claims. The invention, itself, however, both as to its organization and method of operation, as well as additional objects and advantages thereof, will best be understood from the following description when read in connection with the accompanying drawing, in which:

FIGURE 1 is a schematic circuit diagram, partially in block diagram form of the horizontal scanning waveform generating portion of a television receiver including a blocking oscillator constructed in accordance with the present invention; and FIGURE 2 is a series of waveform diagrams (not drawn to scale) to which reference will be made in the explanation of the circuit of FIGURE 1.

Referring to FIGURE 1, a blocking oscillator constructed in accordance with the present invention includes a transistor 10 having base **10*b*, collector 10*c* and emitter 10*e* electrodes. Emitter electrode 10*e* is grounded while collector electrode 10*c* is coupled to a suitable positive potential supply (e.g. +30 v.) by means of the series combination of a primary winding 11*a* of a three winding transformer 11 and resistors 12 and 13. Capacitors 14 and 15 bypass resistors 12 and 13, respectively, to ground. The emitter-collector circuit of transistor 10 is regeneratively coupled to the base-emitter circuit thereof by means of a feedback winding 11*b* inductively associated with primary winding 11*a* and having one end coupled to base electrode 10*b*. The other end of feedback winding 11*b* is coupled to the series combination of: (1) A series resonant circuit 16 essentially comprising a capacitor 17 and an inductor 18; and (2) a parallel resonant circuit 19 comprising a capacitor 20 and an inductor 21. The parallel resonant circuit 19, like emiter electrode 10*e*, is returned to ground. A switching capacitor 22 and a damping resistor 23 each are coupled in parallel with inductor 18. Capacitor 22 is selected to provide a circuit path around inductor 18 when transistor 10 is rendered conductive in order to permit rapid turn-on of transistor 10**.

Capacitor 17 is coupled by means of the series combination of a resistor 25 and a frequency controlling potentiometer or "hold" control 24 to a positive potential at the junction of primary winding **11*a* and resistor 12. A damping circuit comprising the series combination of a resistor 26 and a diode 27 is coupled across primary winding 11*a*. An output signal produced across winding 11*a* is coupled by means of a third winding 11*c* of transformer 11 and an RC coupling circuit 29 to a transistor amplifier 30. The coupling circuit 29 and transistor 30 comprise a portion of a horizontal driver circuit 28. The amplified output of driver circuit 28 is coupled to a horizontal output circuit 31, the output circuit 31 being coupled, in turn to a horizontal deflection winding 32 associated with a kinescope 33**.

In the circuit shown in FIGURE 1, inductance 18 preferably is made variable to permit adjustment of the resonant frequency of series resonant circuit 16. The series resonant frequency is adjusted according to the desired width of duration of pulses to be produced by the oscillator. The series resonant frequency is adjusted (see FIGURE 2*c*) such that the current through circuit 16 varies sinusoidally for a period slightly in excess of one-half cycle in a time interval equal to the desired pulse width. The extent to which the duration of oscillation exceeds one-half cycle is determined by the magnitude of negative current which must be supplied by the series resonant circuit 16 to cancel out a positive direct current supplied to the base electrode **10*b* from the potential supply (+30 v.) and to remove the charge carriers stored in base 10*b***. In a typical application of the invention to a television horizontal deflection circuit, the excess of oscillation beyond one-half cycle may be of the order of one-twentieth to one-tenth of a cycle.

Inductance 21 also preferably is variable to permit adjustment of the resonant frequency of parallel resonant circuit 19. The parallel resonant frequency is adjusted approximately equal to the desired repetition frequency of the blocking oscillator such that the potential at base **10*b* (see FIGURE 2A) passes through the turn-on potential for transistor 10 (a small positive potential) with a relatively steep slope at the beginning of each operating cycle of the blocking oscillator. It is desirable to select the parallel resonant frequency as low as possible, consistent with the requirement that the waveform contribution of parallel resonant circuit 19 causes the composite waveform applied to base electrode 10*b* to increase sharply at the beginning of each oscillation cycle, so that any variations in components which make up circuit 19** or variations in circuit supply voltages do not have a substantial effect on the operating frequency of the blocking oscillator.

In the application of the invention to be described herein, the resonant frequency of parallel resonant circuit 19 is adjusted in the neighborhood of one-half the resonant frequency of series resonant circuit 16. Typically, in a horizontal scanning waveform generating circuit for a television receiver, the operating cycle of the blocking oscillator is approximately sixty-three microseconds (63 $\mu$sec.) in duration (e.g. in FIGURE 2, the interval from time to $t_0$ to time $t_2$ is equal to approximately 63 $\mu$sec.). In that application, it has been found advantageous to adjust the conduction time of the blocking oscillator transistor 10 and hence the output pulse produced by the blocking oscillator (FIGURE 2B) to approximately fifteen microseconds in duration.

As noted above, the width of each pulse produced by transistor 10 is determined primarily by the resonant frequency of the series resonant circuit 16, while the interpulse period (e.g. time $t_1$ to time $t_2$ in FIGURE 2) may be varied to a limited extent by variation of the resonant frequency of the parallel resonant circuit 19. In order to obtain the desired independence of the series and parallel resonant frequencies, capacitor 20 is selected substantially larger than capacitor 17 (e.g. of the order of seven or more times as large). Capacitor 22, on the other hand, is selected substantially smaller than either capacitor 20 or capacitor 17 (e.g. of the order of one-seventh or less the value of capacitor 17) to provide the desired shunting of inductor 18 at the beginning of each conduction cycle and thereby substantially decrease the rise time of the output pulses produced by the oscillator as compared with the rise time of pulses produced where inductor 18 is not so shunted.

Where the above-recited proportioning of capacitors is utilized, in accordance with the invention, inductors 18 and 21 may be selected having inductances variable over approximately the same range. Components selected in these proportions, furthermore, may have standard commercial tolerances without any necessity for selection of unduly expensive components.

In the operation of the horizontal deflection system shown in FIGURE 1, the blocking oscillator transistor 10 periodically is rendered highly conductive and substantially nonconductive according to pre-determined variations in the energy stored in the components comprising series resonant circuit 16 and parallel resonant circuit 19. Referring to the waveform diagrams shown in FIGURE 2, a complete oscillation cycle will be described commencing at a time $t_0$ when transistor 10 is cut off but about to commence conduction.

At time $t_0$, as will be pointed out more fully below, the algebraic sum of the potentials across capacitors 17, 22 and 20 and therefore the potential at base **10*b* (FIGURE 2A) is positive with respect to the potential of emitter 10*e*. The net positive potential across the capacitors initially is attributable to the coupling of capacitor 17 to the positive potential supply (+30 v.). The positive base-emitter bias applied to transistor 10 in conjunction with the positive potential applied to collector 10*c* by means of the potential supply (+30 v.) initiates conduction in both the base-emitter and collector-emitter circuits of transistor 10. The base-emitter current (FIGURE 2C) initially increases very rapidly as the relatively small capacitor 22 coupled across inductor 18 is charged. The initial spike of base current at time $t_0$ (see FIGURE 2C) is attributable to this charging of capacitor 22. The increasing base current is amplified by transistor 10 to produce an increasing collector current. The increasing collector current, in turn causes the collector potential (FIGURE 2B) to fall rapidly. The potential change in the collector circuit is inverted and regeneratively coupled via windings 11*a* and 11*b* to base 10*b*, driving transistor 10 rapidly into saturation. In a circuit utilizing a capacitor 22 having a nominal value of 820 picofarads, the rise time of the pulse produced at collector 10*c*** may be of the order of 0.1 microseconds.

After the initial surge of base current drives transistor 10 into saturation, the base current (FIGURE 2C) varies in a sinusoidal manner. The frequency of the sinusoidal variation is determined by the resonant frequency of the series resonant circuit comprising capacitor 17, inductor 18 and capacitor 20. As noted above, capacitor 20 is selected seven or more times as great as capacitor 17. Therefore capacitor 20 has substantially no effect on the series resonant frequency and may be considered as a short circuit to ground across inductor 21 insofar as series resonant circuit 16 is concerned.

The potentials of both base **10*b* and collector 10*c* remain substantially constant, approximately equal and equal to a fraction of a volt throughout substantially the entire conduction portion of the blocking oscillator cycle. In the vicinity of time $t_1$, the current in resonant circuit 16 completes a full half-cycle of oscillation and the base current (FIGURE 2C) approaches zero. The current in resonant circuit 16 continues to decrease for a short interval past the full half cycle until the base current, which includes a positive direct component supplied from the potential supply (+30 v.), decreases substantially to zero or, if necessary becomes slightly negative to remove charge carriers stored in base 10*b***.

As the base current approaches zero, transistor 10 is driven out of saturation and the collector current begins to decrease. The potential at collector **10*c* rises, the rise in collector potential being inverted and regeneratively applied to base 10*b* by means of windings 11*a* and 11*b* of transformer 11. The base potential and collector potential fall to a negative value and rise to a positive value, respectively, in a rapid manner, substantially cutting off conduction in transistor 10. The energy stored in transformer 11 during the conduction portion of the oscillator cycle is dissipated in the damping circuit comprising resistor 26 and diode 27**.

Throughout the time interval $t_1$ to $t_2$, the potential at base **10*b* is substantially equal to the sum of the potentials across capacitors 17, 22 and 20. At time $t_1$, when transistor 10 initially is driven to cutoff, a damped, high frequency oscillation (see FIGURE 2A) is produced and continues for a brief period (e.g. one cycle) in the parallel circuit comprising inductor 18, capacitor 22 and resistor 23, which is resonant at a much higher frequency than the series resonant circuit including the inductor 18 and capacitor 17. Thereafter the potential at base 10*b* rises towards the positive supply potential as capacitor 17 discharges exponentially through a circuit including resistor 25 and hold control potentiometer 24. Potentiometer 24 is adjusted such that the base potential (FIGURE 2A) passes through zero and reaches the slightly positive turn-on potential of transistor 10 at a time $t_2$ such that the operational cycle of the blocking oscillator is equal in duration to an entire horizontal scanning cycle (e.g. 63 $\mu$sec.). The exponential increase in the potential at base 10*b* is modified, in accordance with the present invention, by the sinusoidal variation in potential which takes place across parallel resonant crcuit 19. The frequency of oscillation of circuit 19 is so adjusted that the sinusoidal component of potential causes the net potential at base 10*b* to rise sharply at time $t_2$ to the turn-on potential of transistor 10**.

At time $t_2$, transistor 10 is driven into conduction and the oscillation cycle described above is repeated.

The pulse width and interpulse period of the output waveform (FIGURE 2B) are substantially independent of each other and of variations in transistor parameters and supply potential by virtue of the independent series resonant circuit 16 and parallel resonant circuit 19.

The output pulse waveform (FIGURE 2B) produced at collector $10c$ is applied, in the well-known manner, via winding $11c$ to coupling circuit 29 associated with horizontal driver circuit 28. An amplified pulse is applied by horizontal driver circuit 28 to horizontal output circuit 31 wherein the pulse waveform is integrated to produce a sawtooth current waveform. The sawtooth current waveform is applied to the horizontal deflection winding 32 associated with kinescope 33 to deflect an electron beam across the image display surface of kinescope 33 in the well-known manner.

In the illustrated embodiment of the invention, the resonant frequency of parallel resonant circuit 19 is substantially less than (e.g. about one-half) the resonant frequency of series resonant circuit 16. If, for example, the resonant frequency of parallel resonant circuit 19 were selected approximately equal to that of series resonant circuit 16, parallel circuit 19 would pass through several oscillation cycles during the interpulse period. In that case, a relatively small percentage change in component values in circuit 19 would change the shape of the waveform applied to base $10b$ at turn-on more substantially than if the same percentage change were to occur with respect to the components in the illustrated embodiment of the present invention.

In accordance with current practice in the television art, a potential derived from an automatic frequency control system may also be applied in the base circuit of transistor 10, such as at terminal 35, in order to maintain the blocking oscillator output in synchronism with synchronizing signals supplied as part of the television broadcast signal.

An embodiment of the present invention applicable to television receivers includes the following components:

| | |
|---|---|
| Transistor **10** | RCA type 2N3568. |
| Resistor **12** | 1,000 ohms. |
| Resistor **13** | 220 ohms. |
| Capacitor **14** | 100 microfarads. |
| Capacitor **15** | 250 microfarads. |
| Capacitor **17** | .0068 microfarad. |
| Inductor **18** | 1–3 millihenries (adjustable). |
| Capacitor **20** | .047 microfarad. |
| Inductor **21** | 1–3 millihenries (adjustable). |
| Capacitor **22** | 820 picofarads. |
| Resistor **23** | 1,800 ohms. |
| Potentiometer **24** | 15,000 ohms (adjustable). |
| Resistor **25** | 4,700 ohms. |
| Resistor **26** | 56 ohms. |
| Diode **27** | Type 1N60. |

What is claimed is:

1. A transistor blocking oscillator for producing a regularly recurring pulse output comprising:

a transistor having an input circuit and an output circuit, said input circuit comprising means including a first capacitor for supplying an exponential potential determinative of the inter-pulse period of said output pulses, a parallel resonant circuit having a first inductance and a second capacitor tuned to a frequency approximately equal to the operating frequency of the oscillator for providing, in conjunction with said first capacitor, a rapidly changing input potential to said transistor to start each oscillation cycle, and a second inductor coupled in series relation with said first capacitor, said first capacitor and second inductor forming a series resonant circuit tuned to a frequency substantially greater than said parallel resonant frequency and selected such that the duration of each output pulse exceeds the duration of one-half cycle of oscillation in said series resonant circuit by a fraction of a cycle, said input circuit further comprising a third capacitor having a substantially smaller capacitance than either said first or second capacitor and coupled in parallel with said second inductor for bypassing said inductor to permit rapid turn-on of said transistor.

2. A transistor blocking oscillator for producing regularly recurring output pulses comprising:

a transistor having an input circuit and an output circuit, said input circuit comprising a potential supply, a resistor and a first capacitor coupled in series relation and determinative of the interpulse period of said output pulses, a parallel resonant circuit having a first inductor and a second capacitor tuned to a frequency approximately equal to the operating frequency of the oscillator for providing a rapidly changing input to said transistor to start each oscillation cycle, and a second inductor coupled in series relation with said first capacitor, said first capacitor and second inductor forming a series resonant circuit for controlling the duration of pulses produced by the oscillator, said series resonant circuit being tuned to a frequency several times as great as said parallel resonant frequency and selected such that the duration of each output pulse exceeds the duration of one-half cycle of oscillation in said series resonant circuit by a fraction of a cycle, said input circuit further comprising a third capacitor having a substantially smaller capacitance than either said first or second capacitor and coupled in parallel with said second inductor for bypassing said inductor to permit rapid turn-on of said transistor.

3. A transistor blocking oscillator for producing regularly recurring output pulses comprising:

a transistor having an input circuit and an output circuit, said input circuit comprising means including a first capacitor for supplying an exponential potential substantially determinative of the interpulse period of said output pulses, an inductor coupled in series relation with said first capacitor, said first capacitor and said inductor forming a series resonant circuit tuned to a frequency such that the duration of each output pulse exceeds the duration of one-half cycle of oscillation in said series resonant circuit by a fraction of a cycle, said input circuit further comprising means including an additional capacitor having a substantially smaller capacitance than said first capacitor coupled in parallel with said inductor for bypassing said inductor to permit rapid turn-on of said transistor and a resistor coupled in parallel with the combination of said additional capacitor and inductor for damping relatively high frequency oscillations in said combination, whereby a potential waveform is produced in said input circuit which is substantially free of amplitude variations at said relatively high frequency.

4. A transistor blocking oscillator for producing regularly recurring output pulses comprising:

a transistor having an input circuit and an output circuit, said input circuit comprising means including a first capacitor for supplying an exponential potential substantially determinative of the interpulse period of said output pulses, a parallel resonant circuit having a first inductor and a second capacitor tuned to a frequency approximately equal to the operating frequency of the oscillator for providing, in conjunction with said first capacitor, an input potential to said transistor which remains substantially below turn-on potential of said transistor substantially throughout said interpulse period and passes rapidly through turn-on potential to start each oscillation cycle, a second inductor coupled in series relation with said first capacitor for forming therewith a series resonant circuit tuned to a frequency determinative of the duration of said output pulses, said input circuit further comprising means including a third capacitor having a capacitance substantially smaller than either of said first and second capacitors, said third capacitor being coupled in parallel with said second inductor for bypassing said inductor to permit rapid turn-on of said transistor.

5. In a television receiver, a blocking oscillator for producing regularly recurring output pulses at a repetition rate equal to the horizontal scanning rate, the duration of said pulses being slightly greater than the duration of the retrace portion of a horizontal scanning cycle, said oscillator comprising:

a transistor having an input circuit and output circuit, said output circuit including a transformer having first and second inductively coupled windings for coupling said output pulses to a horizontal scanning waveform generator, said input circuit including a third winding inductively coupled to said first winding for regeneratively coupling potential variations in said output circuit to said input circuit, said input circuit further including the series combination of a parallel resonant circuit and a series resonant circuit, said series resonant circuit comprising a series capacitor and a series inductor tuned to a resonant frequency such that the duration of one-half cycle of oscillation at said resonant frequency is slightly greater than the duration of the retrace portion of a deflection cycle, said parallel resonant circuit comprising a separate capacitor and a separate inductor tuned to a frequency approximately equal to said horizontal scanning rate, said input circuit further including a potential source coupled in series with a variable resistor, said resistor being coupled in series with said series capacitor, adjustable to control the rate of discharge of energy stored in said series capacitor and thereby to vary the repetition rate of pulses produced by the oscillator, said input circuit still further including a third capacitor coupled in parallel with said series inductor and having a capacitance substantially less than either said series or said separate capacitors so as to permit rapid turn-on of said transistor, and a resistor coupled in parallel with the combination of said third capacitor and series inductor for damping relatively high frequency oscillations in said combination, whereby a potential waveform is produced in said input circuit during the trace portion of a deflection cycle which is substantially free of variations at frequencies greater than the horizontal scanning frequency.

6. In a television receiver, a blocking oscillator for producing regularly recurring output pulses at a repetition rate equal to the horizontal scanning rate, the duration of said pulses being slightly greater than the retrace portion of a horizontal scanning cycle, said oscillator comprising:

a transistor having an input circuit and an output circuit, said output circuit including a transformer having first and second inductively coupled windings for coupling said output pulses to a horizontal scanning waveform generator, said input circuit including a third winding inductively coupled to said first winding for regeneratively coupling potential variations in said output circuit to said input circuit, said input circuit further including the series combination of a parallel resonant circuit and a series resonant circuit, said series resonant circuit comprising a series capacitor and a series inductor tuned to a resonant frequency such that the duration of one-half cycle of oscillation at said resonant frequency is slightly greater than the retrace portion of a deflection cycle, said parallel resonant circuit comprising a separate capacitor and a separate inductor tuned to a frequency substantially less than said series resonant frequency and approximately equal to said horizontal scanning rate, said series and separate inductors having inductances of substantially the same value and said series capacitor having a capacitance substantially less than the capacitance of said separate capacitor, said input circuit further including a potential source coupled in series with a variable resistor, said resistor being coupled to said series capacitor and adjustable to control the rate of discharge of energy stored in said series capacitor and thereby vary the repetition rate of pulses produced by the oscillator, said input circuit still further including a third capacitor coupled in parallel with said series inductor and having a capacitance substantially less than either said series or said separate capacitor so as to permit rapid turn-on of said transistor, and a resistor coupled in parallel with the combination of said third capacitor and series inductor for damping relatively high frequency oscillations in said combination, whereby a potential waveform is produced in said input circuit during the trace portion of a deflection cycle which is substantially free of variations at frequencies greater than the horizontal scanning frequency.

References Cited by the Examiner

UNITED STATES PATENTS

| | | | |
|---|---|---|---|
| 2,702,348 | 2/1955 | Stacy | 331—146 |
| 3,013,219 | 12/1961 | Fischman | 331—112 |

ROY LAKE, *Primary Examiner.*

J. KOMINSKI, *Assistant Examiner.*